US010741157B2

(12) United States Patent
Jung et al.

(10) Patent No.: US 10,741,157 B2
(45) Date of Patent: Aug. 11, 2020

(54) ELECTRONIC DEVICE WITH SOUNDPROOF STRUCTURE

(71) Applicant: Samsung Electronics Co., Ltd., Suwon-si, Gyeonggi-do (KR)

(72) Inventors: Kisung Jung, Seoul (KR); Sungkyo Seo, Suwon-si (KR); Kyungil Im, Seoul (KR); Hui Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/840,395

(22) Filed: Dec. 13, 2017

(65) Prior Publication Data

US 2018/0166057 A1 Jun. 14, 2018

(30) Foreign Application Priority Data

Dec. 14, 2016 (KR) .......................... 10-2016-0170472

(51) Int. Cl.
*G06F 1/20* (2006.01)
*H01L 23/467* (2006.01)
*G10K 11/16* (2006.01)
*G06F 1/16* (2006.01)

(52) U.S. Cl.
CPC ............ *G10K 11/16* (2013.01); *G06F 1/1616* (2013.01); *G06F 1/203* (2013.01); *H01L 23/467* (2013.01); *G10K 2210/11* (2013.01)

(58) Field of Classification Search
CPC .... F04D 29/668; F04D 29/664; F04D 25/166; F04D 19/002; F04D 29/4226; F04D 29/663; F04D 19/007; G06F 1/20; G06F 1/1616; G06F 1/203; H05K 7/20172; H05K 7/20727; H01L 23/467; G10K 2210/109; G10K 2210/11; G10K 11/16
See application file for complete search history.

(56) References Cited

U.S. PATENT DOCUMENTS

| 3,174,682 | A | * | 3/1965 | Wilfert | ............... B60H 1/00471 |
| | | | | | 415/119 |
| 3,312,389 | A | * | 4/1967 | Matsui | .................. F04D 29/664 |
| | | | | | 415/119 |
| 3,779,341 | A | * | 12/1973 | Huggins | .................... F01N 1/10 |
| | | | | | 123/41.49 |
| 5,186,605 | A | * | 2/1993 | Tracy | .................... F04D 29/668 |
| | | | | | 415/213.1 |

(Continued)

FOREIGN PATENT DOCUMENTS

| CN | 102387693 A | 3/2012 |
| CN | 103777720 A | 5/2014 |
| JP | 2007-247444 A | 9/2007 |

OTHER PUBLICATIONS

Acoustics research centre, Sharpness and booming, Oct. 18, 2017.

*Primary Examiner* — Adam B Dravininkas
(74) *Attorney, Agent, or Firm* — Jefferson IP Law, LLP

(57) ABSTRACT

An electronic device having a soundproof structure is provided. The electronic device includes a housing including an internal space, an inlet and an outlet formed on one side of the housing, a cooling fan disposed in the internal space, and configured to create an air-flow introduced from the inlet which is discharged to the outlet, and a sound absorbing member disposed to surround, at least in part, a peripheral area of the cooling fan in a direction to not obstruct the air-flow.

20 Claims, 10 Drawing Sheets

(56) References Cited

U.S. PATENT DOCUMENTS

| | | | | |
|---|---|---|---|---|
| 5,917,698 A * | 6/1999 | Viallet | | H05K 7/20172 165/80.3 |
| 6,847,524 B2 * | 1/2005 | Tomioka | | G06F 1/203 165/121 |
| 7,602,607 B2 * | 10/2009 | Mongia | | G06F 1/20 165/104.33 |
| 7,643,284 B2 * | 1/2010 | Nakamura | | G06F 1/203 165/104.33 |
| 7,649,736 B2 * | 1/2010 | Hongo | | G06F 1/203 165/104.21 |
| 8,422,224 B2 * | 4/2013 | Tanaka | | G06F 1/203 165/104.33 |
| 8,953,313 B2 * | 2/2015 | MacDonald | | G06F 1/203 361/679.49 |
| 9,098,234 B2 * | 8/2015 | Fujiwara | | G06F 1/1601 |
| 2002/0182060 A1 * | 12/2002 | Chou | | F04D 29/664 415/119 |
| 2005/0103477 A1 * | 5/2005 | Kim | | G06F 1/203 165/104.33 |
| 2006/0232934 A1 * | 10/2006 | Kusamoto | | G06F 1/203 361/697 |
| 2007/0121292 A1 * | 5/2007 | Ariga | | G06F 1/203 361/695 |
| 2008/0169152 A1 * | 7/2008 | Furuya | | F24F 5/0042 181/224 |
| 2008/0247864 A1 | 10/2008 | Chang et al. | | |
| 2011/0123036 A1 * | 5/2011 | Barath | | G10K 11/178 381/71.3 |
| 2012/0229435 A1 * | 9/2012 | Hoshi | | G02F 1/133308 345/207 |
| 2013/0250514 A1 * | 9/2013 | Tsao | | H05K 7/20145 361/692 |
| 2013/0279112 A1 * | 10/2013 | Kim | | H05K 7/20154 361/692 |
| 2016/0265511 A1 | 9/2016 | Petersen et al. | | |

* cited by examiner

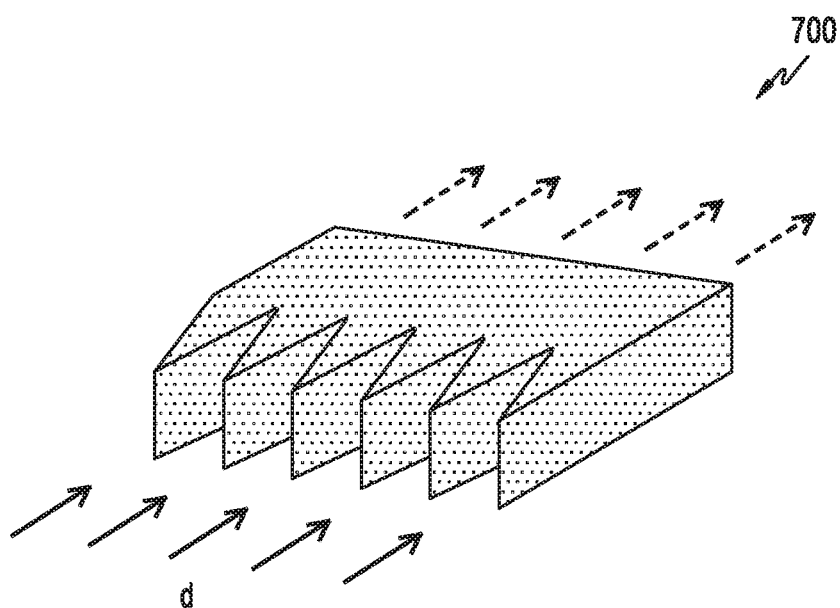
FIG.7A
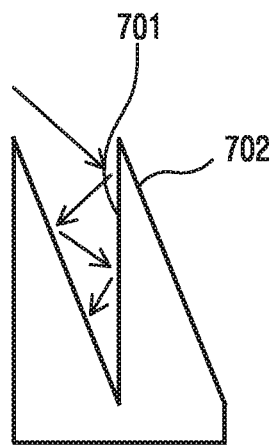 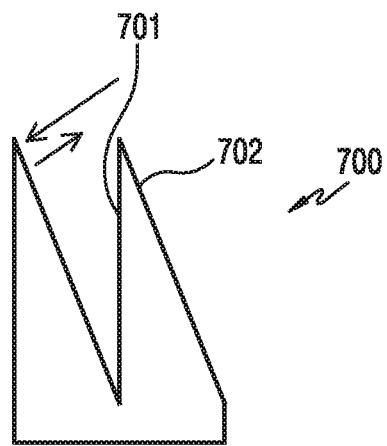
FIG.7B  FIG.7C

ELECTRONIC DEVICE WITH SOUNDPROOF STRUCTURE

CROSS-REFERENCE TO RELATED APPLICATION(S)

This application claims the benefit under 35 U.S.C. § 119(a) of a Korean patent application filed on Dec. 14, 2016 in the Korean Intellectual Property Office and assigned Serial number 10-2016-0170472, the entire disclosure of which is hereby incorporated by reference.

TECHNICAL FIELD

The present disclosure relates to a soundproof structure for reducing noise generated inside an electronic device.

BACKGROUND

Electronic devices, such as mobile phones, tablets, and notebooks, are widely used, by which users may access a variety of contents while carrying the same. This electronic device may adopt various components and modules, such as a module for transmitting and receiving data, a battery, a driving chip, and the like, as well as a circuit board on which internal components are mounted to enable access to various contents.

Some components of the internal modules described above may emit heat of high temperature depending on performance. The high-temperature heat generated from the component may cause deterioration of the performance of the component, or may influence the performance of other components and modules. Therefore, heat-dissipation products having various shapes or structures are provided in electronic devices in order to reduce the high-temperature heat emitted by components. Particularly, an electronic device, such as a notebook which requires high performance, adopts a strong heat source movement using a heat sink or a heat pipe and a method of discharging high-temperature air generated by the heat-emitting components to the outside through air circulation created by the rotation of a cooling fan, thereby solving the heat generation problem.

The above information is presented as background information only to assist with an understanding of the present disclosure. No determination has been made, and no assertion is made, as to whether any of the above might be applicable as prior art with regard to the present disclosure.

SUMMARY

In recent years, as notebooks and electronic devices have gradually become thinner, various components included in the electronic devices have also become thinner. At the same time, the thickness of the cooling fan undertaking the heat dissipation of the heat-emitting components has also been reduced. If the rotary blades of the cooling fan are thin, the cooling fan is required to operate at a high rotation speed in order to secure a sufficient flow rate, and thus, the noise generated in the cooling fan will increase. Furthermore, the noise generated by the thin-walled rotary blades that rotate at a high speed mainly contains components of relatively high frequency band, which may be referred to as sharper noise. Such sharper noise may give an unpleasant feeling to the user of the electronic device or a third party.

Aspects of the present disclosure are to address at least the above-mentioned problems and/or disadvantages and to provide at least the advantages described below. Accordingly, an aspect of the present disclosure is to provide an electronic device can solve the above problems by adopting a soundproof structure.

In accordance with an aspect of the present disclosure, an electronic device is provided. The electronic device includes a housing including an internal space, an inlet and an outlet formed on one side of the housing, a cooling fan disposed in the internal space, and configured to create an air-flow introduced from the inlet which is discharged to the outlet, and a sound absorbing member disposed to surround, at least in part, a peripheral area of the cooling fan in a direction to not obstruct the air-flow.

In accordance with another aspect of the present disclosure, an electronic device is provided. The electronic device includes a housing including an upper surface and a back surface to form an internal space, a first side directed in a first direction parallel to the upper and back surfaces, and an inlet and an outlet formed on the first side, a cooling fan disposed in front of the outlet in the internal space of the housing, and configured to suck (e.g., draw) air in the internal space in a second direction from the inlet to the cooling fan, which is perpendicular to the first direction, to form an air-flow to be discharged to the outlet, and a sound absorbing member disposed to surround, at least in part, the cooling fan in a third direction, which is an opposite direction of the first direction, and in a fourth direction, which is an opposite direction of the second direction.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 7A, 7B, and 7C illustrate a perspective view and a cross-sectional view of a sound absorbing member in a shape according to various embodiments of the present disclosure;

Throughout the drawings, like reference numerals will be understood to refer to like parts, components, and structures.

DETAILED DESCRIPTION

Figure 1:
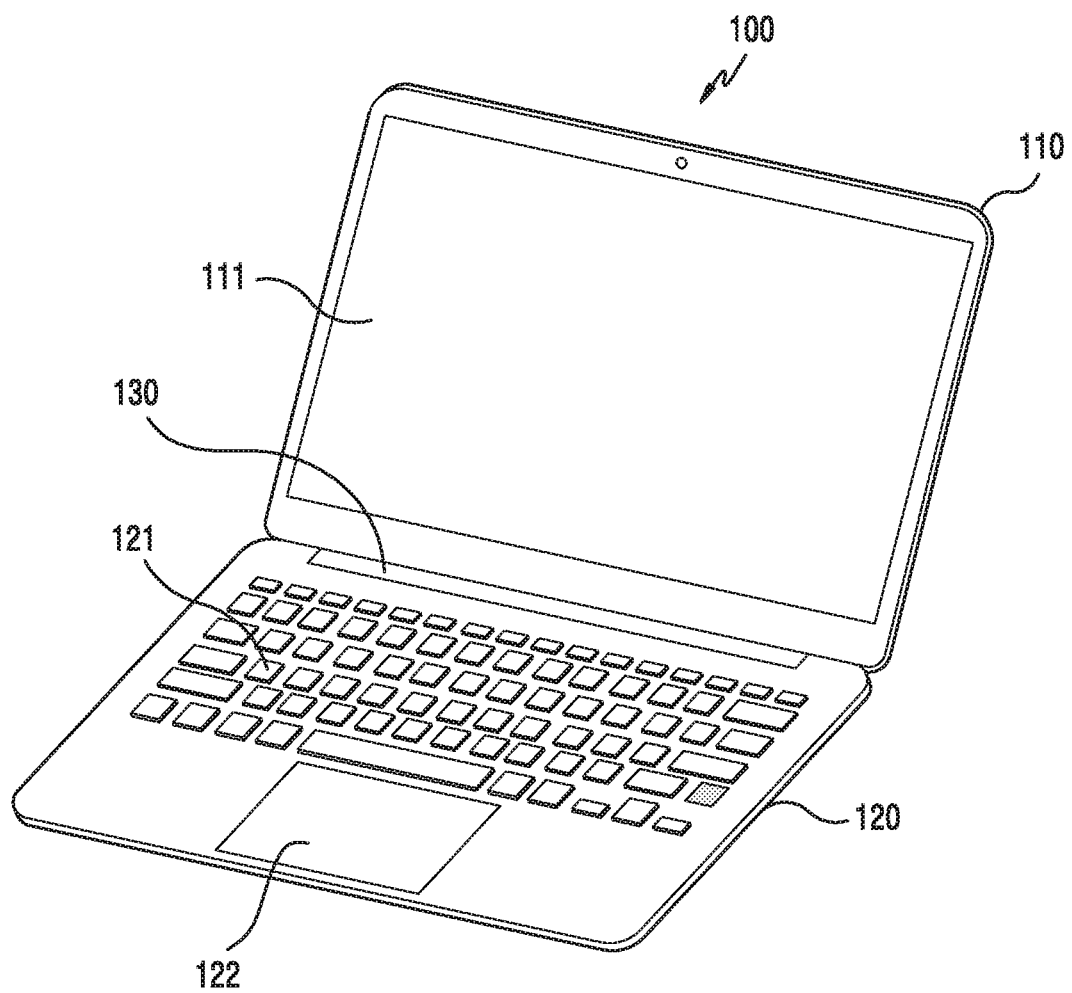
FIG. 1 is a perspective view of an electronic device having a soundproof structure provided therein according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the expression "have", "may have", "include", or "may include" refers to the existence of a corresponding feature (e.g., numeral, function, operation, or constituent element such as component), and does not exclude one or more additional features.

As used herein, the expression "A or B", "at least one of A and/or B", or "one or more of A and/or B" may include any or all possible combinations of items enumerated together. For example, "A or B," "at least one of A and B," or "at least one of A or B" may refer to all cases of (1) including at least one A, (2) including at least one B, or (3) including both at least one A and at least one B.

The expression "a first", "a second", "the first", or "the second" used in various embodiments of the present disclosure may modify various components regardless of the order and/or the importance but does not limit the corresponding components. The above-described expressions may be used to distinguish an element from another element. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The expression "configured to" may not necessarily mean "specially designed to" in terms of hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

Unless defined otherwise, all terms used herein, including technical terms and scientific terms, may have the same meaning as commonly understood by a person of ordinary skill in the art to which the present disclosure pertains. Terms, such as those defined in commonly used dictionaries, should be interpreted as having a meaning that is the same or similar to their meaning in the context of the relevant art and will not be interpreted in an idealized or overly formal sense unless expressly so defined herein. In some cases, even the term defined in the present disclosure should not be interpreted to exclude various embodiments of the present disclosure.

For example, the electronic device may include at least one of a smartphone, a tablet personal computer (PC), a mobile phone, a video phone, an electronic book (e-book) reader, a desktop PC, a laptop PC, a netbook computer, a personal digital assistant (PDA), a portable multimedia player (PMP), an moving picture experts group (MPEG-1 or MPEG-2) audio layer-3 (MP3) player, a mobile medical appliance, a camera, and a wearable device (e.g., a head-mounted-device (HMD) such as electronic glasses, electronic clothes, an electronic bracelet, an electronic necklace, an electronic appcessory, electronic tattoos, or a smart watch).

According to some embodiments, the electronic device may be a smart home appliance. The smart home appliance may include at least one of, for example, a television, a digital versatile disc (DVD) player, an audio, a refrigerator, an air conditioner, a vacuum cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

FIG. 1 is a perspective view of an electronic device 100 having a soundproof structure provided therein according to an embodiment of the present disclosure. The electronic device 100 may be any suitable computing device, such as a laptop computer, a desktop computer, a telephone, a smartphone, or a gaming device.

Referring to FIG. 1, the electronic device 100, according to an embodiment, may include a first electronic device 110, a second electronic device 120, and a connecting portion 130 for connecting the first and second electronic devices 110 and 120 to each other. The connecting portion 130 may mechanically or electrically connect the first and second electronic devices 110 and 120 to each other. For example, the connecting portion 130 may include a hinge structure for mechanically connecting the first and second electronic devices 110 and 120 to each other. The first electronic device 110 may include a display 111 and may be referred to as a display part. The second electronic device 120 may include a keyboard 121 and a touch pad 122 provided on the upper surface thereof, and various components, such as a substrate, a main board, a CPU, and a battery, may be mounted therein. Thus, the second electronic device 120 may be referred to as a body part.

However, various embodiments are not limited thereto, and the electronic device 100 may be configured such that the display part and an input unit (e.g., the keyboard 121 and the touch pad 122) are integrally formed as a single body, or may be configured such that the display part and the input unit are detachably coupled to each other.

Figure 2:
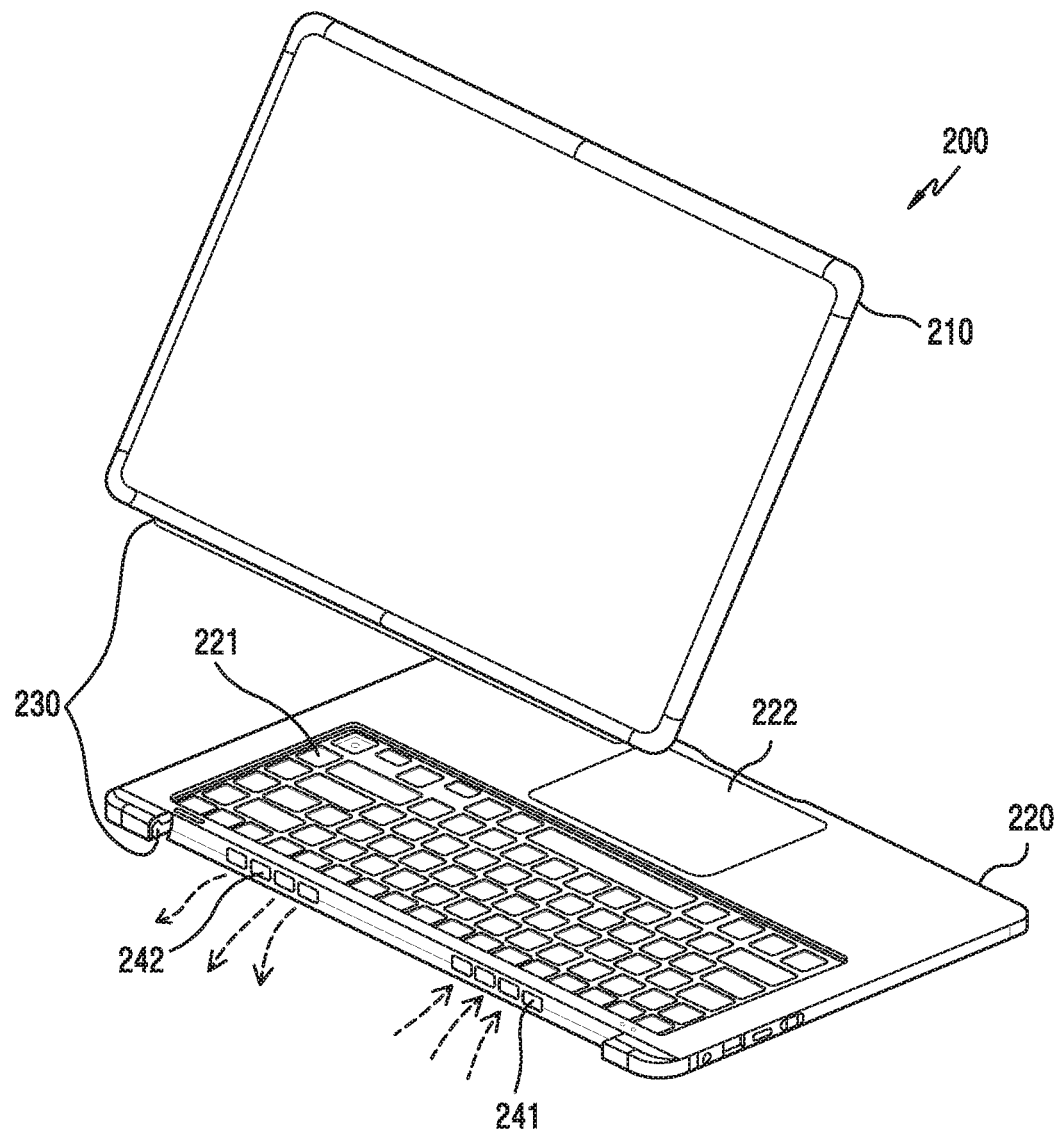
FIG. 2 is an exploded perspective view showing a back side of an electronic device having a soundproof structure provided therein according to an embodiment of the present disclosure.

FIG. 2 is an exploded perspective view showing a back side of an electronic device 200 having a soundproof structure provided therein according to an embodiment of the present disclosure.

Referring to FIG. 2, the electronic device 200, according to an embodiment, may include a display part 210, a body part 220, and a hinge structure 230. The display part 210 and the body part 220 may be folded or unfolded using the hinge structure 230 provided on each side thereof. In the case of a foldable electronic device 200, a display (not shown) of the display part 210 and a keyboard 221 and a touch pad 222 of the body part 220 can be protected from external impacts.

The keyboard 221 and the touch pad 222 may be mounted on the upper surface of the body part 220. The body part 220 may have various components, such as a main board, a central processing unit (CPU), and a battery, which are mounted therein. A ventilation hole for discharging heat to the outside may be formed on one side of the body part 220. The one side is directed in a first direction parallel to the upper and back surfaces. For example, the body part 220 may have an inlet 241, through which air is introduced from the outside, and an outlet 242, through which an air inside is discharged, formed on one side thereof. A cooling fan may be further mounted inside the body part 220. The air introduced through the inlet 241 may be discharged through the outlet 242 due to an air-flow created by the operation of the cooling fan, so that heat generated in the body part 220 may be released to the outside. That is, it is possible to reduce the heat generation of the electronic device through the air-flow created by the cooling fan.

Figure 3A:
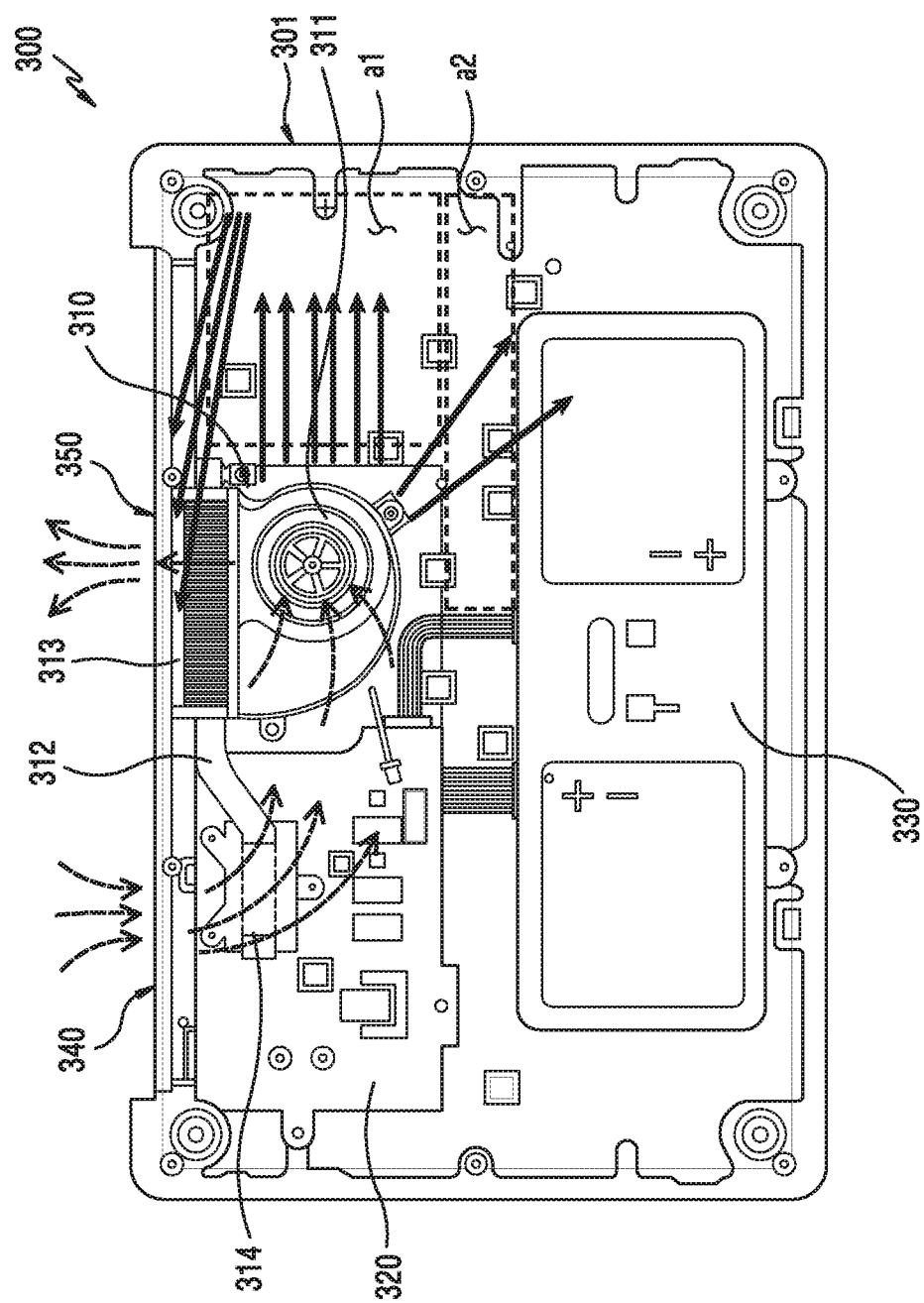
FIG. 3A is a cross-sectional view showing the typical interior of an electronic device including a heat-dissipation structure according to an embodiment of the present disclosure.

FIG. 3A is a cross-sectional view showing the typical interior of an electronic device including a heat-dissipation structure according to an embodiment of the present disclosure.

Figure 3B:
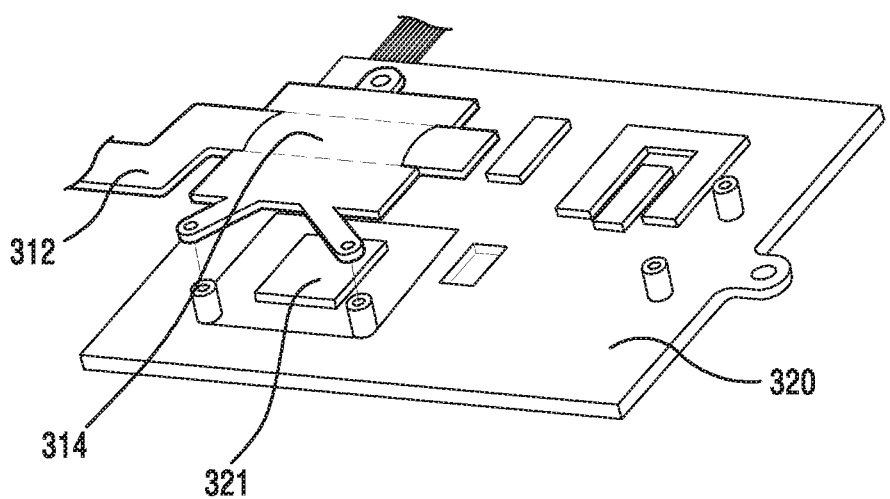
FIG. 3B is an exploded perspective view illustrating a heat-emitting component and a heat-dissipation unit of the electronic device shown in FIG. 3A according to an embodiment of the present disclosure.

FIG. 3B is an exploded perspective view illustrating a heat-emitting component and a heat-dissipation unit of the electronic device shown in FIG. 3A according to an embodiment of the present disclosure.

Referring to FIGS. 3A and 3B, various components for driving an electronic device may be mounted inside the electronic device 300. For example, a heat-dissipation unit 310, a main board 320, and a battery 330 may be mounted inside the electronic device 300.

Various components including a heat-emitting component 321 may be mounted on the main board 320. For example, a central processing unit (CPU), a graphic chip, and the like may be included. The CPU may be a component for controlling processes, such as interpretation of instructions, calculation and comparison of data, and the like, and the graphic chip may be a component for processing graphic data of contents displayed on the display. The CPU or graphic chip may be a main heat-emitting component of the electronic device 300. In other words, most of the heat emitted in various electronic devices (e.g., laptop PCs) may be generated from the CPU or graphic chip.

A heat-dissipation unit 310 may be installed inside the electronic device 300 in order to discharge the heat generated from the main heat-emitting component to the outside. The heat-dissipation unit 310 may be comprised of a cooling fan 311, a heat pipe 312, heat-dissipation fins 313, a heat sink 314, and the like. The cooling fan 311 may discharge air inside the electronic device toward an outlet 350 and the discharged air may be replaced with air introduced through the inlet. The cooling fan 311 may create an air-flow from the inlet to the outlet inside the body part. That is, an air-flow may be created in the direction of the arrows (dotted lines) by the operation of the cooling fan.

The cooling fan 311 may be disposed in front of the outlet 350 inside the electronic device 300 and heat-dissipation fins 313 may be disposed between the outlet 350 and the cooling fan 311. The heat-dissipation fins 313 may be formed to have a structure enabling the air-flow created by the cooling fan 311 to pass therethrough. A heat pipe 312 may be disposed on the lower surface of the heat-dissipation fins 313.

Referring to FIG. 3B, the heat pipe 312, according to an embodiment, may be disposed along the heat-dissipation fins 313 so as to extend to the heat sink 314. The heat-emitting component 321 may be mounted under the heat pipe 312 and/or the heat sink 314 to be in contact with the heat pipe 312 and/or the heat sink 314. The heat sink 314 and/or the heat pipe 312 may transfer the heat generated by the heat-emitting component 321 to the heat-dissipation fins 313. In addition, the heat sink 314 may perform a function of radiating the heat transferred from the heat-emitting component 321 into the air. The air heated by the heat radiation of the heat sink 314 may be primarily cooled down by the fresh air introduced through the inlet 340. In addition, the air-flow created by the cooling fan 311 may pass through the heat-dissipation fins 313 in order to thereby discharge the heat, which is generated from the heat-emitting component 321 and is transferred to the heat-dissipation fins 313 through the heat sink 314 and/or the heat pipe 312, to the outside of the electronic device 300. In another embodiment, the heat pipe 312 may be in direct contact with the heat-emitting component 321 without the heat sink 314. In another embodiment, a thermally conductive material (not shown) may be interposed between the heat sink 314 and the heat-emitting component 321.

The flow rate of the air created by the cooling fan 311 may be determined by the thickness, rotation speed, and the like of the rotary blades of the cooling fan 311. As the electronic device 300 becomes thinner, the thickness of the rotary blades of the cooling fan 311 is also reduced. Thus, the cooling fan is required to rotate at a high speed in order to secure a sufficient flow rate. When the thin rotary blades rotate at a high speed, sharper noise containing many components of high frequency band may be generated. As means for measuring the sharper noise containing many components of high frequency band, the sharper noise may be represented as sharpness, which may be measured in a unit of acum. That is, the noise containing many components of high frequency band may be measured to have a high acum. For example, in a specific environment, when rotary blades having a thickness of 5 mm rotate at 4016 RPMs (revolutions per minute), a sharpness of 1.7 acum is measured. On the other hand, when rotary blades having a thickness of 4.3 mm rotate at 4016 revolutions per minute (RPMs), a sharpness of 2.27 acum may be measured. In this case, if the rotation speed is reduced in order to reduce the sharpness, the heat-dissipation function may not be performed sufficiently, which may cause a problem of limiting the performance of the heat-emitting component. That is, the high-speed rotation of the thin rotary blades of the cooling fan may generate noise of high sharpness, which may give an unpleasant feeling to the user so that the usability of the electronic device may deteriorate.

In addition, the noise (i.e., the sharpness) may be generated from the cooling fan 311, and may be transmitted in the direction of the arrows (see dotted lines). An area (a1) from the cooling fan 311 to the outer surface 301 of the electronic device 300 and an area (a2) from the cooling fan 311 to other components (e.g., the battery 330) may play the role of a sound box to amplify the transmitted noise.

Hereinafter, a soundproof structure capable of reducing the sharper noise will be described with reference to the accompanying drawings.

Figure 4:
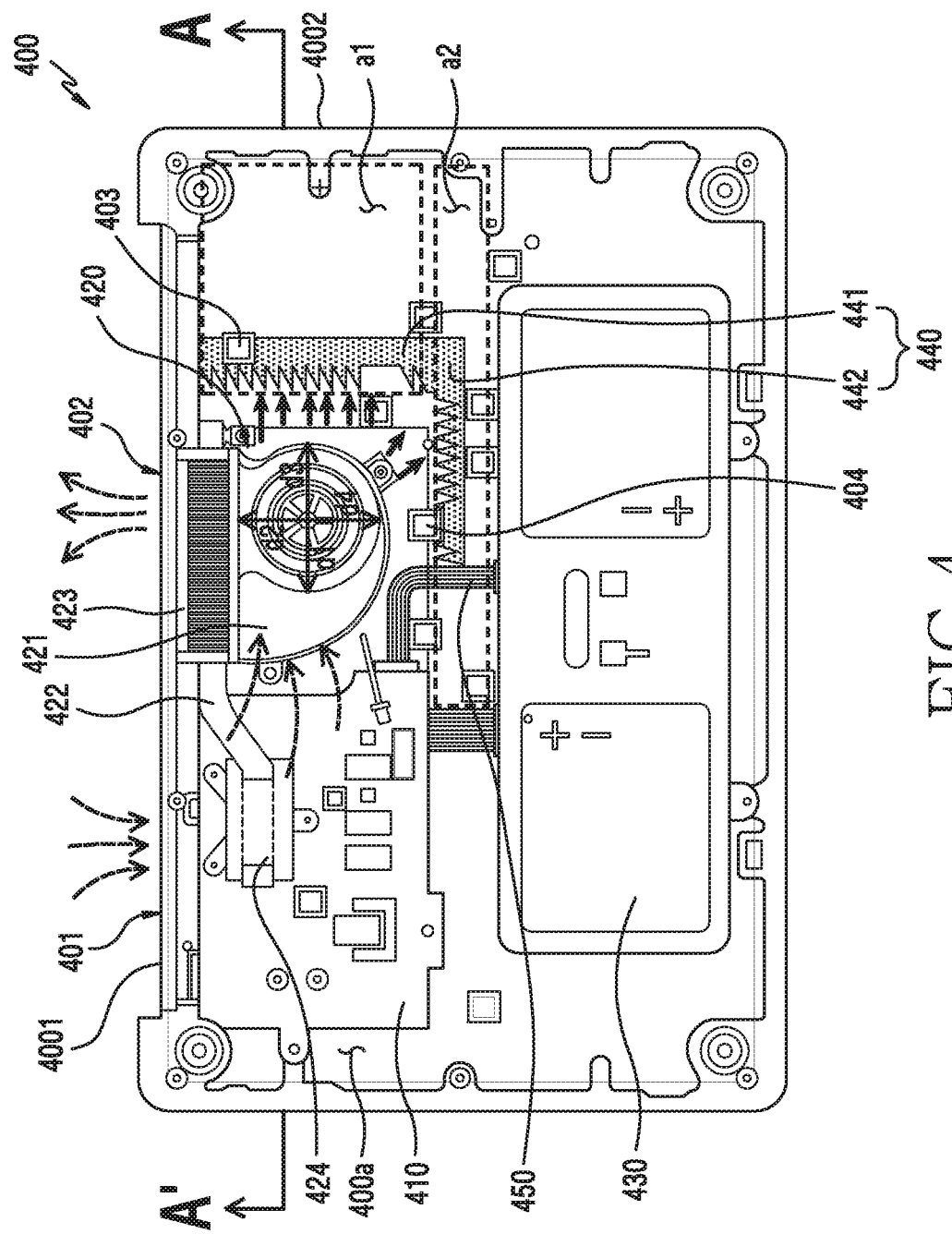
FIG. 4 is a cross-sectional view showing the interior of an electronic device including a soundproof structure according to an embodiment of the present disclosure.
Figure 5:
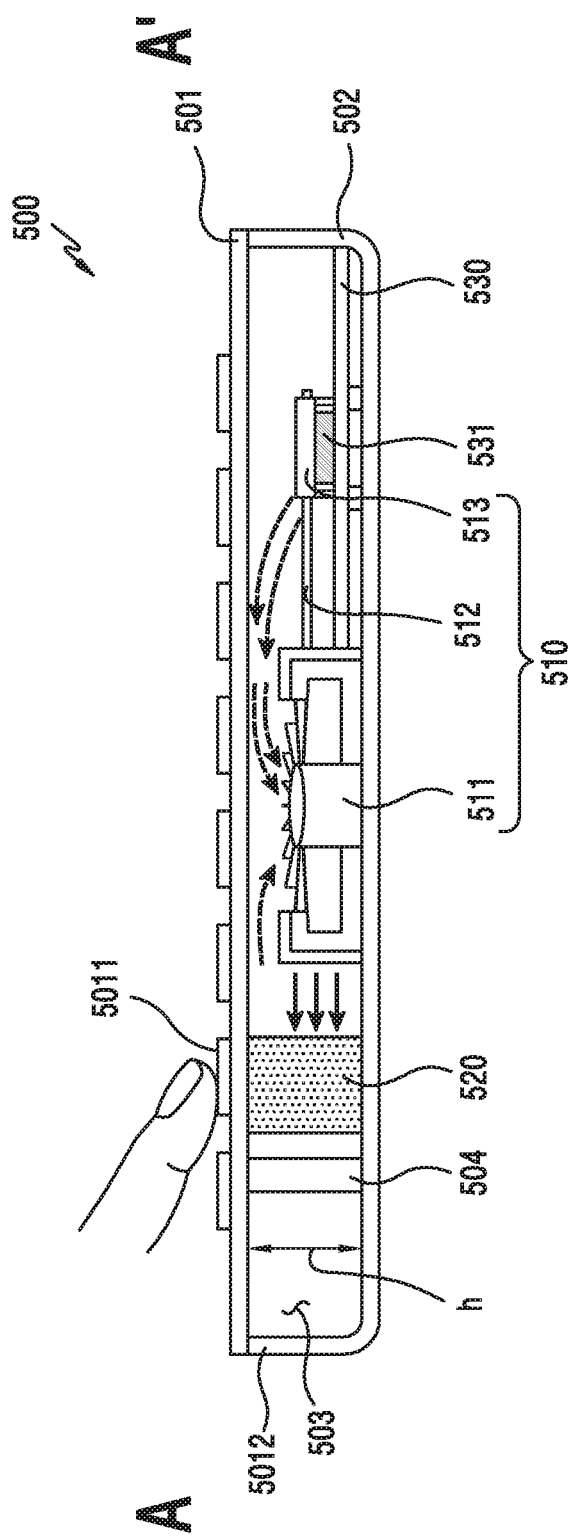
FIG. 5 is a cross-sectional view of the electronic device including a soundproof structure taken along the cutaway line A-A' in FIG. 4 according to an embodiment of the present disclosure.

FIG. 4 is a cross-sectional view showing the interior of an electronic device 400 including a soundproof structure according to an embodiment of the present disclosure. The function of the soundproof structure will be described in more detail with reference to FIG. 5 as well. Here, FIG. 5 is a cross-sectional view of the electronic device including a soundproof structure taken along the cutaway line A-A' in FIG. 4, according to various embodiments of the present disclosure.

Referring to FIG. 4, the electronic device 400, according to an embodiment, may have an internal space 400a formed therein. The internal space 400a of the electronic device 400 may contain a main board 410, a heat-dissipation unit 420, a battery 430, and a sound absorbing member 440.

An inlet 401 and an outlet 402 may be formed on one side of the electronic device 400. For example, the inlet 401 and the outlet 402 may be disposed on the back side 4001 of the electronic device, where the electronic device 400 is coupled to an electronic device including a display by means of a hinge structure. Therefore, when the electronic device including a display is coupled, the inlet 401 and the outlet 402 are not visible to the user from the outside, which may improve the aesthetics in terms of design. However, various embodiments are not limited thereto, and the inlet 401 and the outlet 402 may be disposed on another side, or may be disposed at a position to be seen from the outside. Alternatively, the inlet 401 and the outlet 402 may be disposed on different sides of the electronic device 400, respectively.

The main board 410 may be formed in a plate to have a predetermined shape. The main board 410 may have various components mounted thereon. For example, a central processing unit (CPU) (not shown), a memory, a basic input/output system (BIOS), various connectors, and the like may be included. Here, the CPU (not shown) may be a main heat-emitting component of the electronic device 400. The main board 410, according to an embodiment, may be disposed approximately in front of the inlet 401. Heat generated from the CPU (not shown) may be transferred to the heat sink 424. The air heated by radiation of the heat transferred to the heat sink 424 may be primarily cooled down by the fresh air introduced through the inlet 401.

The heat-dissipation unit 420 may be comprised of a cooling fan 421, a heat sink 424 and/or a heat pipe 422, and heat-dissipation fins 423. The cooling fan 421 may discharge air in the internal space 400a of the electronic device 400 toward the outlet 402, and the discharged air may be replaced with fresh air through the inlet 401. The cooling fan 421 may create an air-flow from the inlet 401 to the outlet 402 in the internal space 400a. That is, an air-flow may be formed in the direction of the arrows (see dotted lines) by the operation of the cooling fan 421.

In an embodiment of the present disclosure, the cooling fan 421 may be disposed in front of the outlet inside the internal space 400a, and heat-dissipation fins 423 may be disposed between the outlet and the cooling fan. The heat-dissipation fins 423 may be formed in a structure through which the air-flow created by the cooling fan 421 can pass. A heat pipe 422 may be disposed on the lower surface of the heat-dissipation fins 423. The heat pipe 422 may extend to the heat sink 424 along the heat-dissipation fins 423. The central processing unit (not shown) as a main heat-emitting component may be mounted under the heat pipe 422 and/or the heat sink 424 to be in contact with the heat pipe 422 and/or the heat sink 424. For example, the heat pipe 422 and/or the heat sink 424 may transfer heat generated in the CPU (not shown) to the heat-dissipation fins 423. The heat sink 424 may perform a function of radiating heat transferred from the CPU (not shown) into the air. The air heated by heat radiation of the heat sink 424 may be primarily cooled down by the fresh air introduced through the inlet 401. In addition, the air-flow created by the cooling fan 421 may pass through the heat-dissipation fins 423 in order to thereby discharge the heat, which is generated from the CPU (not shown) and is transferred to the heat-dissipation fins 423 through the heat pipe 422 and/or the heat sink 424, to the outside of the electronic device 400. In another embodiment, the heat pipe 422 may be in direct contact with the heat-emitting component without the heat sink 424. In another embodiment, a thermally conductive material (not shown) may be interposed between the heat sink 424 and the heat-emitting component. According to still another embodiment, although it is not shown in the drawing, the electronic device 400 may include a plurality of heat-emitting components. For example, the main board 410 may further adopt a graphic chip having a large amount of heat-emission, and may further include a heat pipe to transfer the heat generated from the graphic chip to be released by means of the air-flow created by the cooling fan.

The sound absorbing member 440, according to various embodiments of the present disclosure, may be disposed around the cooling fan 421. For example, the sound absorbing member 440 is disposed so as not to overlap the cooling fan when viewed from above. The sound absorbing member 440, according to an embodiment, may be disposed in an area (a1) between the cooling fan 421 and one side 4002 of the electronic device 400. Alternatively, the sound absorbing member 440 may be disposed in an area between the cooling fan 421 and other components mounted in the internal space 400a. For example, the sound absorbing member 440 may be disposed between the cooling fan 421 and the battery 430. In other words, the sound absorbing member 440 may be disposed in any area that blocks the noise, which is generated from the cooling fan 421 and is transferred to a predetermined area (a1 or a2), to be amplified in the internal space 400a.

The sound absorbing member 440, according to an embodiment, may be disposed around the cooling fan 421 so as to surround, at least in part, the same in a direction to not obstruct the air-flow created by the cooling fan 421. For example, the sound absorbing member 440 may not be disposed in the direction of an arrow (d1) in which air is introduced from the inlet 401 and in the direction of an arrow (d2) in which air is discharged to the outlet 402. Alternatively, the sound absorbing member 440 may be disposed to surround, at least in part, the cooling fan 421 in the direction of an arrow (d3) in which noise generated from the cooling fan 421 proceeds toward one side 4002 of the electronic device 400 or in the direction of an arrow (d4) in which noise generated from the cooling fan 421 proceeds toward other components.

The sound absorbing member 440, according to an embodiment, may be comprised of a set of a plurality of sound absorbing members. For example, the sound absorbing member 440 may be comprised of a set of a first sound absorbing member 441 and a second sound absorbing member 442. The first sound absorbing member 441 may be disposed around the cooling fan 421 in the direction of an arrow (d3) in which noise generated from cooling fan 421 proceeds toward one side 4002 of the electronic device 400. The second sound absorbing member 442 may be disposed around the cooling fan 421 in the direction of an arrow (d4) from the cooling fan 421 toward other components. However, various embodiments are not limited thereto, and the sound absorbing member 440 may be integrally formed or may be formed of a set of three or more sound absorbing members.

The sound absorbing member 440, according to an embodiment, may be made of any suitable material. For example, the sound absorbing member 440 may be made of a porous material to absorb noise of high frequency band. The porous material may have numerous fine holes or fine gaps therein. When a noise enters the porous material, sound waves may be transmitted to the air in the holes or gaps to then penetrate into the material. The penetrating noise may be converted into heat energy inside the sound absorbing member 440 and the remaining portion thereof may be transmitted to the back of the sound absorbing member 440.

The sound absorbing member 440, according to an embodiment, may be made of, for example, a surface material of mineral fibers, such as glass-wool or rock-wool, a textile fiber material, such as rugs and curtains, a wood-wool cement board obtained by combining textiles or mineral fibers, and the like. As another example, the sound absorbing member 440 may be formed of a material, such as polyester and polyurethane, or may be formed of a fiber plywood made by pressing polyester fibers into an artboard. A high-density sponge may be used as a kind of polyurethane. That is, the sound absorbing member 440 may be formed of a high-density porous material. However, various embodiments are not limited thereto, and various materials can be used depending on the noise characteristics. For example, the sound absorbing member 440 may be formed in a resonance structure having a sound absorbing effect at a specific frequency of a low-level sound (bass), or may be formed of a plate-like material, such as a plywood or a hard fiber board having a sound absorbing effect at a frequency of a low-level sound (bass).

The sound absorbing member 440, according to an embodiment, may have any suitable shape. For example, the sound absorbing member 440 may be formed in a saw-tooth shape in the direction to receive the noise generated by the cooling fan 421. The saw-tooth shape of the sound absorbing member 440 may improve the soundproof effect by increasing the noise reception area. Alternatively, valleys of the respective teeth allow the received noise to repeatedly penetrate thereto to reduce the magnitude of the noise, thereby improving the soundproof effect.

However, the characteristics of the noise generated from the cooling fan 421 may be determined by various components or interior materials disposed in the internal space 400a of the electronic device 400, as well as by the thickness or rotation speed of the rotary blades. The sound absorption rate of the sound absorbing member 440 may vary depending on the frequency of the noise even in the same material or shape. In addition, the sound absorption rate of the sound absorbing member 440 may also vary depending on the arrangement conditions of the sound absorbing member (e.g., presence or absence of a wall behind the sound absorbing member, the characteristics of the wall, the distance to the wall, and the like), the incident angle of the noise, and the like. Accordingly, the shape and material of the sound absorbing member may be configured in various combinations, and various shapes of the sound absorbing member 440 will be described in detail with reference to FIGS. 6A, 6B, 7A, 7B, 7C, 8A, 8B, 9A, and 9B.

The sound absorbing member 440, according to an embodiment, may have a proper shape to conform to other components or structures of the electronic device 400. For example, the sound absorbing member 440 may include a planar body and a plurality of saw-teeth formed to face the cooling fan 421. In addition, the body of the first sound absorbing member 441 may have at least one recess corresponding to a first post structure 403 of the body part. Alternatively, the first sound absorbing member 441 may not have a saw-tooth shape because of the second structure 404 disposed between the cooling fan 421 and the first sound absorbing member 441. As another example, the second sound absorbing member 442 may be limited in length by the connecting portion 450 between the main board 410 and the battery 430. That is, the sound absorbing member 440 may have various sizes and lengths depending on various components and structures mounted in the electronic device 400.

FIG. 5 is a cross-sectional view of the electronic device including a soundproof structure taken along the cutaway line A-A' in FIG. 4 according to an embodiment of the present disclosure.

Referring to FIG. 5, the electronic device 500, according to an embodiment of the present disclosure, may be configured by a first housing 501 and a second housing 502, and may include a heat-dissipation unit 510, a sound absorbing member 520, and a main board 530. The main board 530 may have various components mounted thereon. For example, a central processing unit (CPU) 531 as a main heat-emitting component may be mounted on the main board 530. An input means (e.g., a keyboard 5011) may be mounted on the upper surface of the first housing 501. The second housing 502 may form the back appearance of the electronic device 500, and may be fixed to the first housing 501 at the respective outer boundaries thereof to form an internal space of the electronic device 500. Thus, the first housing 501 may be referred to as an upper housing, and the second housing 502 may be referred to as a back housing, respectively.

The heat-dissipation unit 510, according to various embodiments of the present disclosure, may include a cooling fan 511, a heat pipe 512, a heat sink 513, and heat-dissipation fins (not shown). The CPU 531 as a main heat-emitting component may be mounted under the heat pipe 512 and/or the heat sink 513 to be in contact with the heat pipe 512 and/or the heat sink 513. For example, the heat pipe 512 and/or the heat sink 513 may transfer heat generated from the CPU 531 to the heat-dissipation fins (not shown). According to an embodiment, the cooling fan 511 may have a thickness less than the height (h) of the internal space 503 formed by the first housing 501 and the second housing 502. The cooling fan 511 may draw (e.g., suck) air through the opening on the upper surface, and may create an air-flow by the rotation of the rotary blades. Here, the cooling fan 511 may create an air-flow in the direction (see dotted lines) from an inlet to the outlet via the cooling fan 511. The air-flow created by the cooling fan 511 may primarily cool down the air heated by heat-emission of the CPU 531 mounted on the main board 530. The sound absorbing member 520 may be disposed around the cooling fan 511 in the direction to not obstruct the air-flow (see dotted lines). For example, the sound absorbing member 520 may be disposed within a predetermined distance from the cooling fan 511 in the direction from the cooling fan 511 toward one side 5012 of the electronic device 500. Therefore, the noise absorbing member 520 may absorb the sharper noise generated from the cooling fan 511 to thereby reduce the same.

The sound absorbing member 520, according to an embodiment, may be formed to have the same height as the height (h) of the internal space 503 of the electronic device 500. The sound absorbing member 520 may improve the structural rigidity of the electronic device 500 together with a post structure 504 of the electronic device 500. Alternatively, the sound absorbing member 520 may improve the rigidity against the force caused by the user's input onto the keyboard 5011. That is, the sound absorbing member 520 may have a function of improving the structural rigidity in addition to the soundproof function.

Referring FIGS. 4 and 5 together, the sound absorbing member, according to various embodiments of the present disclosure, may be disposed around the cooling fan in the direction to not obstruct the air-flow created by the cooling fan, thereby providing a soundproof structure. The soundproof structure provided by the sound absorbing member may provide a function of reducing the sharper noise generated by the cooling fan. In the case where the soundproof structure, according to various embodiments of the present disclosure, is applied, it is experimentally confirmed that the sharpness is reduced from 2.27 acum to 2.06 acum when rotary blades having a thickness of 4.3 mm rotate at 4016 RPMs in a specific environment. Therefore, the disposition of the sound absorbing member to surround a specific area around the cooling fan may provide an electronic device with a soundproof structure. Alternatively, the soundproof structure, according to the various embodiments of the present disclosure, may have functions of concentrating the air-flow created by the cooling fan and of improving the rigidity of the electronic device.

FIGS. 6A, 6B, 7A, 7B, 7C, 8A, 8B, 9A, and 9B illustrate various shapes of a sound absorbing member according to various embodiments of the present disclosure.

Figure 6A:
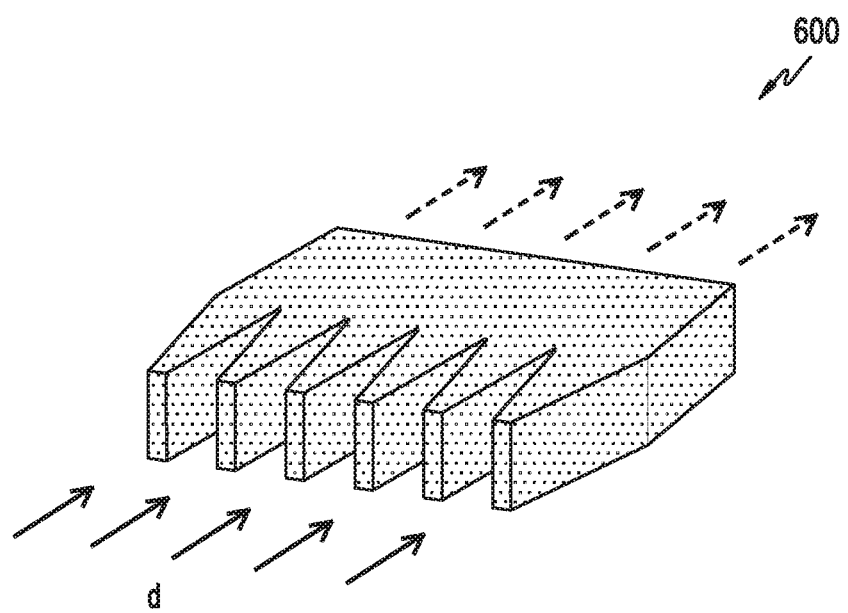
FIGS. 6A and 6B illustrate a perspective view and a cross-sectional view of a sound absorbing member in a shape according to various embodiments of the present disclosure.
Figure 6B:
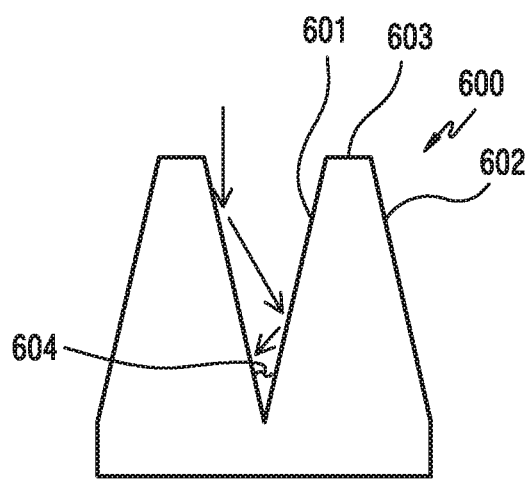

Referring to FIGS. 6A and 6B, the sound absorbing member 600, according to an embodiment of the present disclosure, may have a saw-tooth shape formed in a direction to receive noise. For example, each saw-tooth may have a first inclined portion 601 and a second inclined portion 602, and may further include a flat portion 603 at the end of the saw-tooth. Since the sound absorbing member 600 has a saw-tooth shape, it is possible to increase the noise reception area. Referring to FIG. 6B, the sound absorbing member 600 having a saw-tooth shape, according to the present disclosure, may receive noise in the parallel direction (d), and the noise may proceed to the valleys 604 formed by the inclined portions of the saw-teeth so as to be attenuated while being reflected thereon.

Referring to FIGS. 7A, 7B, and 7C, the sound absorbing member 700, according to an embodiment of the present disclosure, may have a saw-tooth shape formed to receive noise incident at a wide angle. For example, each saw-tooth of the sound absorbing member 700 may be comprised of a vertical portion 701 and an inclined portion 702.

Referring to FIG. 7B, the sound absorbing member 700 having a saw-tooth shape, according to an embodiment of the present disclosure, may attenuate noise incident at a wider angle in one direction (d). However, referring to FIG. 7C, the noise incident in the other direction may be immediately reflected, so that the attenuation effect may be lowered.

Figure 8A:
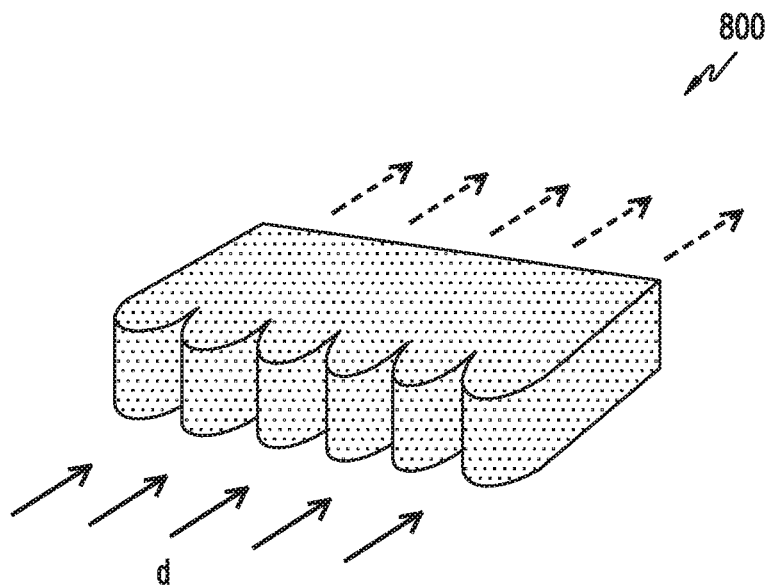
FIGS. 8A and 8B illustrate a perspective view and a cross-sectional view of a sound absorbing member in a shape according to various embodiments of the present disclosure.
Figure 8B:
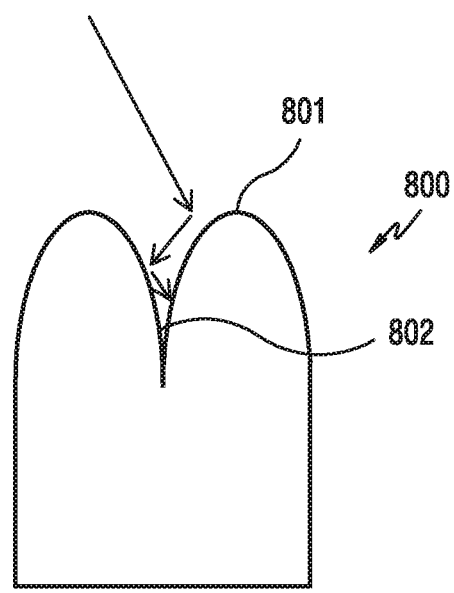

Referring to FIGS. 8A and 8B, the sound absorbing member 800, according to an embodiment of the present disclosure, may be formed in a circular shape so as to receive noise incident at various angles. For example, the sound absorbing member 800 may be formed to have a shape in which a plurality of convex portions 801 are repeatedly arranged. Referring to FIG. 8B, the noise received by the sound absorbing member may be attenuated while proceeding to the valleys 802 formed by the plurality of convex portions 801.

Figure 9A:
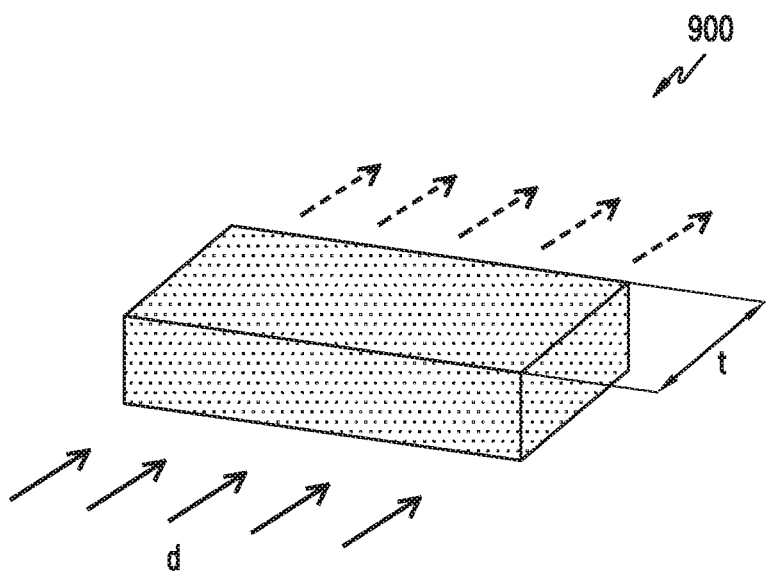
FIGS. 9A and 9B illustrate a perspective view and a cross-sectional view of a sound absorbing member in a shape according to various embodiments of the present disclosure.
Figure 9B:
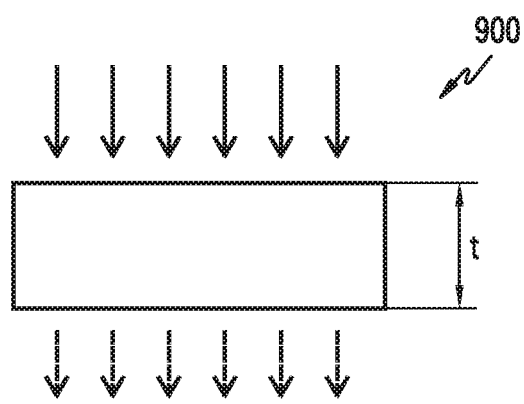

Referring to FIGS. 9A and 9B, the sound absorbing member 900, according to an embodiment of the present disclosure, may have a flat shape in the direction to receive noise. The sound absorbing member 900 having a flat shape may be considered in the case where the area for the disposition thereof is limited. That is, it may be considered in the case where the internal space of the electronic device is not sufficient to accommodate the sound absorbing member 900 having a predetermined thickness in terms of design. For example, the sound absorbing member having a flat shape may be disposed on the upper or back housing of the body part so as to block the noise transmitted in the vertical direction, instead of the parallel direction, with respect to the cooling fan.

That is, the sound absorbing member, according to various embodiments of the present disclosure, may have various shapes as described in FIGS. 6A, 6B, 7A, 7B, 7C, 8A, 8B, 9A, and 9B. Alternatively, the sound absorbing member may be configured to have a combination of various shapes described in FIGS. 6A, 6B, 7A, 7B, 7C, 8A, 8B, 9A, and 9B. The shape, material, and disposition of the sound absorbing member may be variously combined according to the design of the electronic device. For example, the thickness of the rotary blades of the cooling fan, the degree of sharpness of the noise generated depending on the rotation speed, various components and structures mounted in the electronic device, and the like may be variables for determining the shape, material, and disposition of the sound absorbing member.

As described above, the electronic device, according to various embodiments of the present disclosure, adopts a soundproof structure to reduce noise generated from the cooling fan, thereby improving the usability.

The electronic device, according to various embodiments of the present disclosure, adopts a soundproof structure to ensure system performance without controlling the rotation speed of the cooling fan or without controlling the performance of the heat-emitting component itself in order to reduce the generation of noise.

The electronic device, according to various embodiments of the present disclosure, adopts a soundproof structure to concentrate the flow of air in the electronic device, thereby enhancing heat-dissipation performance.

Effects which can be acquired by the present disclosure are not limited to the above described effects, and other effects that have not been mentioned may be clearly understood by those skilled in the art from the following description.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The module may be mechanically or electronically implemented. For example, the "module" according to the present disclosure may include at least one of an application-specific integrated circuit (ASIC) chip, a field-programmable gate arrays (FPGA), and a programmable-logic device for performing operations which has been known or are to be developed hereinafter.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
    a housing including an internal space;
    an inlet and an outlet formed on one side of the housing;
    a heat-emitting device housed in the internal space of the housing;
    a heat dissipation device connected to the heat-emitting device, the heat dissipation device configured to transfer heat generated by the heat-emitting device toward the outlet;
    a cooling fan disposed in front of the outlet in the internal space of the housing, the cooling fan configured to generate an air-flow that draws air from the inlet to the heat-emitting device before entering the cooling fan, and discharges the air out of the outlet; and
    a sound absorbing member disposed to surround, at least in part, a peripheral area of the cooling fan in at least two directions.

2. The electronic device of claim 1, wherein the two directions include:
    one or more directions excluding a first direction from the cooling fan to the outlet; and
    a second direction in which air flows from the inlet to the cooling fan.

3. The electronic device of claim 1, wherein the sound absorbing member is disposed so as not to overlap the cooling fan when viewed from above.

4. The electronic device of claim 1, wherein the sound absorbing member is disposed so as to surround the cooling fan in a third direction that is an opposite direction of a first direction from the cooling fan to the outlet, and in a fourth direction that is an opposite direction of a second direction in which air flows from the inlet to the cooling fan.

5. The electronic device of claim 1, wherein the sound absorbing member is disposed within a predetermined distance from the cooling fan in an area between the other side of the housing and the cooling fan.

6. The electronic device according to claim 1, wherein the sound absorbing member is disposed within a predetermined distance from the cooling fan in an area between the cooling fan and another component disposed in the internal space.

7. The electronic device of claim 1, further comprising:
    a substrate,
    wherein the heat-emitting device includes a heat-emitting component mounted on the substrate, and
    wherein the heat-emitting device includes at least one of a heat pipe or a heat sink disposed between the outlet and the cooling fan to extend to the heat-emitting component.

8. The electronic device of claim 7,
    wherein the substrate is disposed in front of the inlet such that the heat-emitting component is disposed in a path through which the air-flow passes.

9. The electronic device of claim 1, wherein the sound absorbing member comprises:
    a body including a predetermined thickness; and
    a plurality of saw-teeth formed on a surface facing the cooling fan.

10. The electronic device of claim 9, wherein each of the plurality of saw-teeth includes:
    a first inclined portion; and
    a second inclined portion.

11. The electronic device of claim 9, wherein each of the plurality of saw-teeth includes:
    a vertical portion; and
    an inclined portion.

12. The electronic device of claim 1, wherein the sound absorbing member comprises a porous material.

13. The electronic device of claim 12, wherein the porous material includes at least one of glass-wool, rock-wool, a textile fiber material, a wood-wool cement board, polyester, or polyurethane.

14. The electronic device of claim 1, further comprising:
a display device configured to be:
rotatably coupled by a hinge structure provided on one side of the housing; and
folded or unfolded with respect to the housing.

15. The electronic device of claim 14, wherein the absorbing member comprises:
a first sound absorbing member disposed within a predetermined distance from the cooling fan in an area between a second side of the housing facing a third direction that is an opposite direction of a first direction and the cooling fan; and
a second sound absorbing member disposed within a predetermined distance from the cooling fan in an area between the cooling fan and another component disposed in a fourth direction that is an opposite direction of a second direction in which air flows from the inlet to the cooling fan.

16. An electronic device comprising:
a housing including:
an upper surface,
a lower surface,
a first side formed between the upper and lower surfaces, and directed in a first direction,
an internal space formed by the upper surface, lower surface and the first side, and
an inlet and an outlet formed on the first side;
a heat-emitting device housed in the housing;
a heat dissipation device connected to the heat-emitting device, the heat dissipation device configured to transfer heat generated by the heat-emitting device toward the outlet of the housing;
a cooling fan disposed in front of the outlet in the internal space of the housing, the cooling fan draws air in the internal space in a second direction from the inlet to the cooling fan, which is substantially perpendicular to the first direction, to form an air- flow that is discharged to the outlet; and
a sound absorbing member disposed to surround, at least in part, the cooling fan in a third direction, which is an opposite direction of the first direction, and in a fourth direction, which is an opposite direction of the second direction,
wherein the cooling fan generates air flow of air introduced from the inlet that contacts the heat-emitting device before entering the cooling fan, and discharges to the outlet.

17. The electronic device of claim 16, wherein the sound absorbing member is disposed within a predetermined distance from the cooling fan in an area between a second side of the housing facing the third direction and the cooling fan.

18. The electronic device of claim 16, wherein the sound absorbing member is disposed within a predetermined distance from the cooling fan in an area between the cooling fan and another component disposed in the fourth direction.

19. The electronic device of claim 16, wherein the sound absorbing member comprises a body having a predetermined thickness, and a plurality of saw-teeth formed on a surface facing the cooling fan.

20. The electronic device of claim 19, wherein the sound absorbing member comprises a porous material.

* * * * *